(12) United States Patent
Jarvis et al.

(10) Patent No.: US 9,374,919 B2
(45) Date of Patent: Jun. 21, 2016

(54) INSERT MOLDED DEVICE HOUSINGS FOR PORTABLE ELECTRONIC DEVICES

(71) Applicant: Apple Inc., Cupertino, CA (US)

(72) Inventors: Daniel W. Jarvis, Sunnyvale, CA (US); Stephen P. Zadesky, Portola Valley, CA (US); Pinida J. Moolsintong, San Francisco, CA (US); Tang Yew Tan, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 408 days.

(21) Appl. No.: 14/078,368

(22) Filed: Nov. 12, 2013

(65) Prior Publication Data

US 2014/0071601 A1    Mar. 13, 2014

Related U.S. Application Data

(62) Division of application No. 12/895,822, filed on Sep. 30, 2010, now Pat. No. 8,607,444.

(60) Provisional application No. 61/311,328, filed on Mar. 6, 2010.

(51) Int. Cl.
*G06F 1/16* (2006.01)
*H05K 5/02* (2006.01)
*B32B 37/16* (2006.01)
*H05K 5/00* (2006.01)

(52) U.S. Cl.
CPC ............. *H05K 5/0208* (2013.01); *B32B 37/16* (2013.01); *H05K 5/0017* (2013.01); *H05K 5/02* (2013.01); *Y10T 29/49126* (2015.01); *Y10T 29/49128* (2015.01); *Y10T 29/49158* (2015.01)

(58) Field of Classification Search
CPC ...................................................... G06F 1/1626
USPC ........................................................ 361/679.56
See application file for complete search history.

(56) References Cited

U.S. PATENT DOCUMENTS

| | | | |
|---|---|---|---|
| 5,579,036 A | 11/1996 | Yates, IV | |
| 5,650,363 A | 7/1997 | Endroes et al. | |
| 6,555,202 B2 | 4/2003 | Shukuri et al. | |
| 6,796,708 B2 | 9/2004 | Kawamata et al. | |
| 7,636,244 B2 | 12/2009 | Kriege et al. | |
| 7,697,281 B2 | 4/2010 | Dabov et al. | |
| 8,391,010 B2 * | 3/2013 | Rothkopf et al. | 361/708 |

(Continued)

FOREIGN PATENT DOCUMENTS

JP          694848      4/1994
WO    WO2009/126480   10/2009

*Primary Examiner* — Forrest M Phillips
(74) *Attorney, Agent, or Firm* — Downey Brand LLP

(57) ABSTRACT

Improved techniques for forming an electronic device housing in which an outer housing member can be assembled with one or more other housing members of the electronic device are disclosed. The one or more other housing members can together with a thin substrate layer (or thin substrate) form a frame to which the outer housing member can be secured. The thin substrate layer facilitates molding of the one or more other housing members adjacent to the outer housing member. In one embodiment, the outer housing member can be made of glass and the one or more other housing members can be made of a polymer, such as plastic. The substrate layer can, for example, be formed of a polymer or a metal. The resulting electronic device housing can be thin yet be sufficiently strong to be suitable for use in electronic devices, such as portable electronic devices.

20 Claims, 7 Drawing Sheets

(56) References Cited

U.S. PATENT DOCUMENTS

| | | |
|---|---|---|
| 8,551,283 B2 | 10/2013 | Pakula et al. |
| 9,235,240 B2 * | 1/2016 | Pakula .................. G06F 1/1656 |
| 2004/0042168 A1 | 3/2004 | Yang et al. |
| 2005/0286214 A1 | 12/2005 | Chen |
| 2006/0132644 A1 | 6/2006 | Shangguan et al. |
| 2008/0122137 A1 | 5/2008 | Hamaoka |
| 2008/0146293 A1 | 6/2008 | Kim |
| 2008/0264535 A1 | 10/2008 | Yu et al. |
| 2009/0002930 A1 | 1/2009 | Nakanishi et al. |
| 2009/0049773 A1 * | 2/2009 | Zadesky et al. ............ 52/204.62 |
| 2009/0059485 A1 | 3/2009 | Lynch et al. |
| 2009/0059502 A1 | 3/2009 | Filson et al. |
| 2009/0245564 A1 | 10/2009 | Mittleman et al. |
| 2010/0149410 A1 | 6/2010 | Matsuzawa |
| 2011/0187245 A1 | 8/2011 | Pakula et al. |
| 2011/0188180 A1 | 8/2011 | Pakula et al. |
| 2012/0118628 A1 | 5/2012 | Pakula et al. |

\* cited by examiner

INSERT MOLDED DEVICE HOUSINGS FOR PORTABLE ELECTRONIC DEVICES

CROSS REFERENCE TO RELATED APPLICATIONS

This is a divisional of U.S. application Ser. No. 12/895,822 filed Sep. 30, 2010, entitled "METHOD FOR FORMING A HOUSING OF AN ELECTRONIC DEVICE," which claims priority to U.S. Provisional Application Ser. No. 61/311,328 filed Mar. 6, 2010, entitled "INSERT MOLDED DEVICE HOUSINGS FOR PORTABLE ELECTRONIC DEVICES," each of which is incorporated herein by reference.

BACKGROUND

Conventionally, small form factor devices, such as handheld electronic devices, have a display arrangement that includes various layers. The various layers usually include at least a display technology layer, and may additionally include a sensing arrangement and/or a cover window disposed over the display technology layer. By way of example, the display technology layer may include or pertain to a Liquid Crystal Display (LCD) that includes a Liquid Crystal Module (LCM). The LCM generally includes an upper glass sheet and a lower glass sheet that sandwich a liquid crystal layer therebetween. The sensing arrangement may be a touch sensing arrangement such as those used to create a touch screen. For example, a capacitive sensing touch screen can include substantially transparent sensing points or nodes dispersed about a sheet of glass (or plastic). In addition, the cover window, which is typically designed as the outer protective barrier of the layer stack. Conventionally, supporting a cover window and the LCM have used an internal flange but such impedes the ability to make devices thinner and may also impede usage of a peripheral area of the cover window

SUMMARY

The invention relates generally to an electronic device housing in which an outer housing member can be assembled with one or more other housing members of the electronic device. The one or more other housing members can together with a thin substrate layer (or thin substrate) form a frame to which the outer housing member can be secured. The thin substrate layer facilitates molding of the one or more other housing members adjacent to the outer housing member. In one embodiment, the outer housing member can be made of glass and the one or more other housing members can be made of a polymer, such as plastic. The substrate layer can, for example, be formed of a polymer or a metal. The resulting electronic device housing can be thin yet be sufficiently strong to be suitable for use in electronic devices, such as portable electronic devices.

The invention can be implemented in numerous ways, including as a method, system, device, or apparatus. Several embodiments are discussed below.

As a method for assembling a device housing of an electronic device, one embodiment can, for example, include at least: providing an outer housing member for a first portion of the device housing; providing a thin film for an internal structural member of the device housing; securing together the outer housing member and the thin film; and molding an outer molded member for a second portion of the device housing against a surface of the thin film and against at least a surface of the outer housing member. In one implementation, the outer housing member can be a glass outer housing member.

As an electronic device having a device housing including an outer housing member, the device housing can be formed in accordance with a method. In one embodiment, the method can, for example, include at least: providing the outer housing member for a first portion of the device housing; providing a thin film for an internal structural member of the device housing; securing together the outer housing member and the thin film; and molding an outer molded member for a second portion of the device housing against a surface of the thin film and against at least a surface of the outer housing member.

As an electronic device enclosure, one embodiment can, for example, include at least a thin substrate, and a glass cover window for a top surface for the electronic device enclosure. The glass cover window can be secured to the thin substrate. The embodiment of the electronic device can also include at least one molded side member for a side surface for the electronic device enclosure. The at least one molded side member can be molded adjacent to the thin substrate and adjacent to at least one side surface of the glass cover window.

As a method for assembling a device housing of an electronic device, one embodiment can, for example, include at least the operations of: providing an outer housing member for a first portion of the device housing; providing a thin metal substrate for an internal structural member of the device housing, the thin metal substrate having a central opening, the central opening corresponding to a significant portion of the outer housing member; securing together the outer housing member and the thin metal substrate, the central opening in the thin metal substrate being aligned with the outer housing member; and molding an outer molded member for a second portion of the device housing against a surface of the thin metal substrate and against at least a surface of the outer housing member.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF EMBODIMENTS OF THE INVENTION

Figure 1:
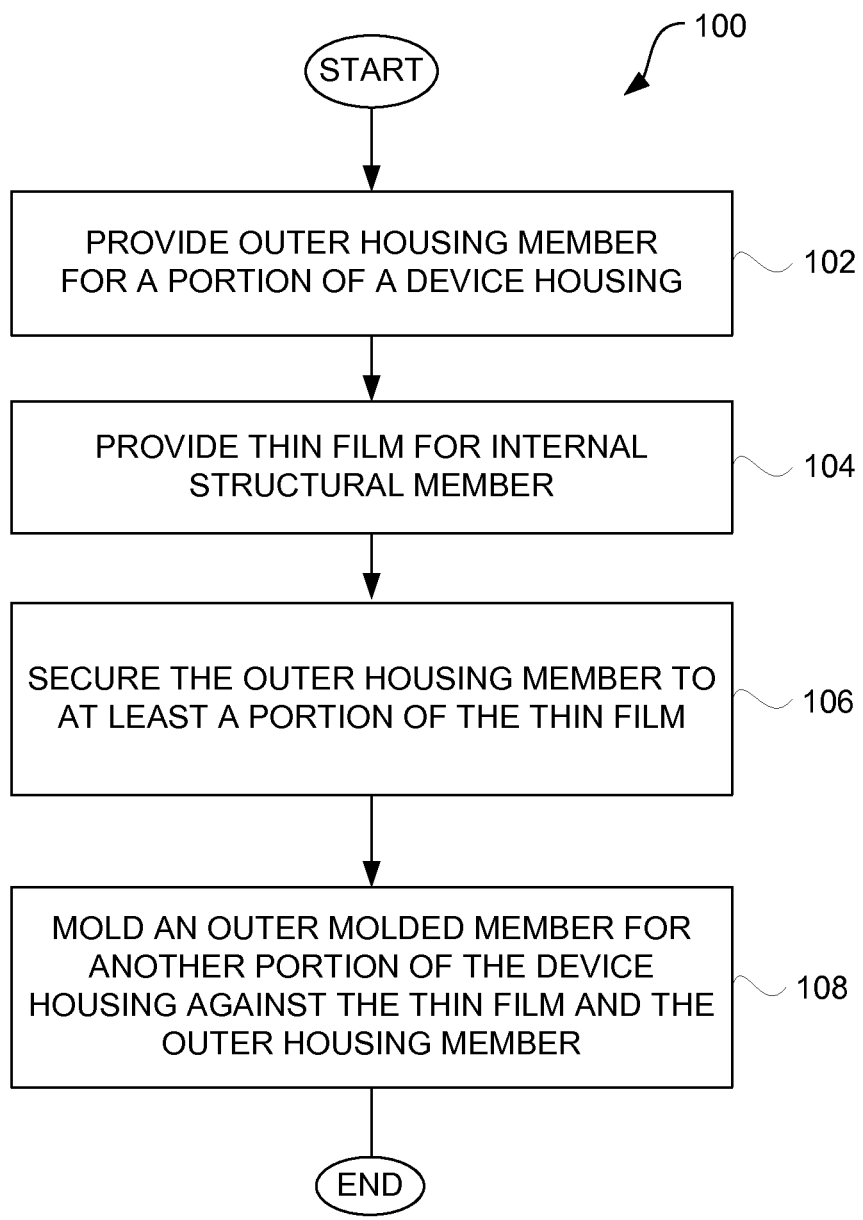
FIG. 1 is a flow diagram of a process for forming a housing for an electronic device according to one embodiment.

The invention relates generally to an electronic device housing in which an outer housing member can be assembled with one or more other housing members of the electronic device. The one or more other housing members can together with a thin substrate layer (or thin substrate) form a frame to which the outer housing member can be secured. The thin substrate layer facilitates molding of the one or more other housing members adjacent to the outer housing member. In one embodiment, the outer housing member can be made of glass and the one or more other housing members can be made of a polymer, such as plastic. The substrate layer can, for example, be formed of a polymer or a metal. The resulting electronic device housing can be thin yet be sufficiently strong to be suitable for use in electronic devices, such as portable electronic devices.

The following detailed description is illustrative only, and is not intended to be in any way limiting. Other embodiments will readily suggest themselves to skilled persons having the benefit of this disclosure. Reference will now be made in detail to implementations as illustrated in the accompanying drawings. The same reference indicators will generally be used throughout the drawings and the following detailed description to refer to the same or like parts. It should be appreciated that the drawings are generally not drawn to scale, and at least some features of the drawings have been exaggerated for ease of illustration.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of the invention can relate to apparatus, systems and methods for forming a housing having a thin glass member for an electronic device. In one example, the glass member may be an outer surface of an electronic device. The glass member may for example correspond to a glass cover that helps form part of a display area of an electronic device (i.e., situated in front of a display either as a separate part or integrated within the display. Alternatively or additionally, the glass member may form a part of the housing. For example, it may form an outer surface other than in the display area.

The apparatus, systems and methods for improving strength of thin glass are especially suitable for glass covers, or displays (e.g., LCD displays), assembled in small form factor electronic devices such as handheld electronic devices (e.g., mobile phones, media players, personal digital assistants, remote controls, etc.). The glass can be thin in these small form factor embodiments, such as less than 3 mm, or more particularly between 0.5 and 2.5 mm, or even more particularly between 0.3 and 1.0 mm. The apparatus, systems and methods can also be used for glass covers or displays for other devices including, but not limited to including, relatively larger form factor electronic devices (e.g., portable computers, tablet computers, displays, monitors, televisions, etc.). The glass can also be thin in these larger form factor embodiments, such as less than 5 mm, or more particularly between 0.5 and 3 mm, or even more particularly between 0.3 and 2.0 mm.

Embodiments are discussed below with reference to FIGS. 1-5B. However, those skilled in the art will readily appreciate that the detailed description given herein with respect to these figures is for explanatory purposes as the invention extends beyond these limited embodiments.

FIG. 1 is a flow diagram of a process 100 for forming a housing for an electronic device according to one embodiment. The process 100 can provide 102 an outer housing member for a portion of a device housing. In one embodiment, the outer housing member is formed of glass. A thin film that is to act as an internal structural member can be provided 104. The outer housing member can be secured 106 to at least a portion of the thin film. For example, a layer of adhesive can be provided between the outer housing member and the portion of the thin film to secure 106 the outer housing member to the portion of the thin film. Thereafter, an outer molded member that serves as another portion of the device housing can be molded 108 (e.g., insert-molded) against the thin film and the outer housing member.

Through use of a thin substrate layer, the housing can support an outer housing member around which other portions of the housing can be formed. The outer housing member is, for example, a glass member. The outer molded member can be formed of a polymer, such as plastic, and can optionally be optically clear at least at some of the portions.

The thin film and the outer molded member can be formed from any of a variety of materials. For example, the polymers, such as plastics (e.g., polycarbonate), acrylic or nylon. In one embodiment, the thin film and/or the outer molded member can be translucent or substantially translucent. When the outer housing member is an outer glass member, the thin film can be transparent (i.e., clear) so that a display module can be adjacent the thin film and remain viewable through the outer glass member and the thin film. The outer molded member can, if desired, also be formed from transparent materials. Once molded, the outer molded member can tightly abut against a least one side of the outer glass member. Since both the outer glass member and the outer molded member can be translucent (i.e., clear), these members can visually blend together at the interface therebetween.

Figure 2:
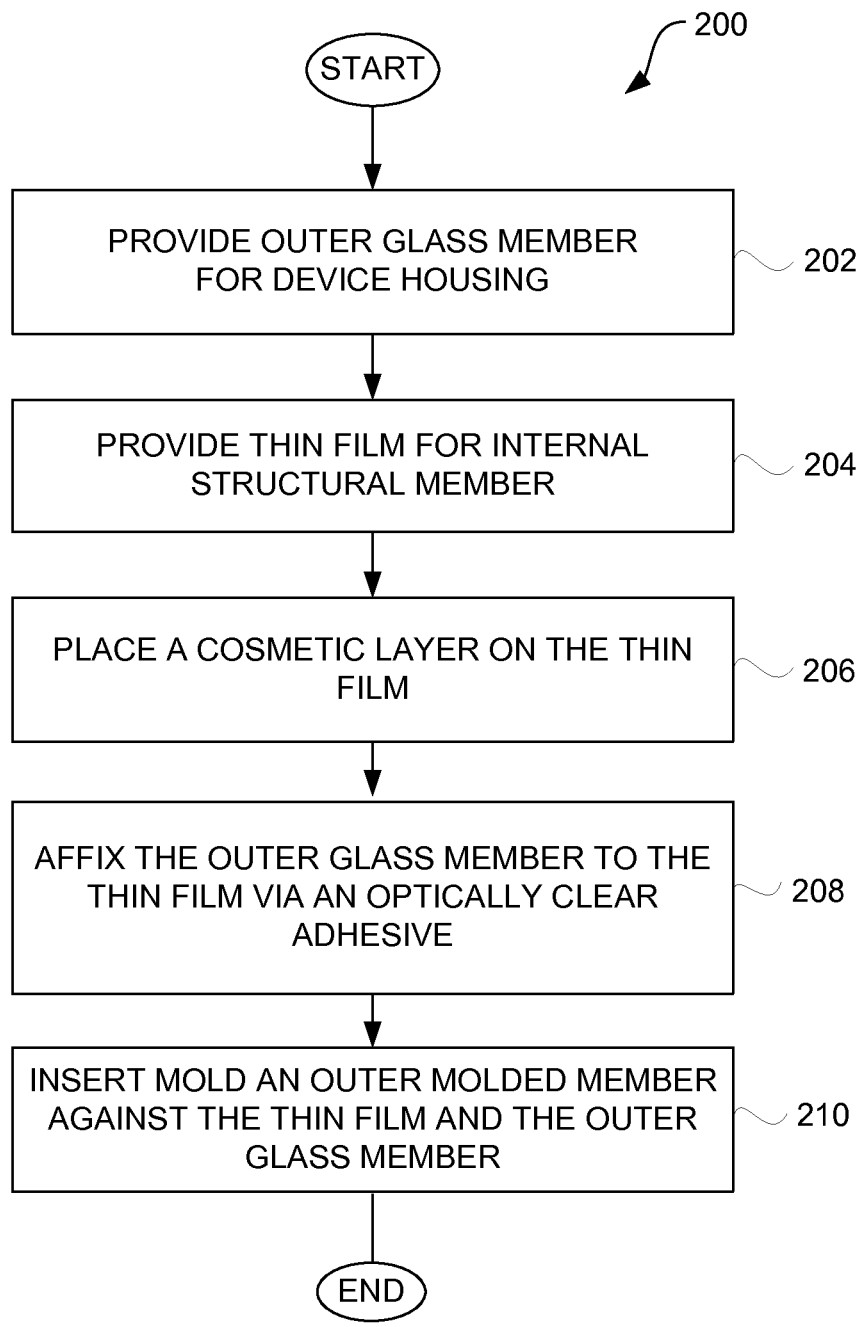
FIG. 2 is a flow diagram of a process for forming a housing for an electronic device according to one embodiment.

FIG. 2 is a flow diagram of a process 200 for forming a housing for an electronic device according to one embodiment. The process 200 can provide an outer glass member for a device housing. A thin film (i.e., thin film substrate) can provide an internal structural member for the device housing. A cosmetic layer can be placed 206 on a portion of the thin film. For example, the cosmetic layer can be placed 206 on only a peripheral region of the thin film. For example, the cosmetic layer can provide a mask to render housing portions internal to the device housing to be hidden. The cosmetic layer can be opaque or partially translucent. In one embodiment, the cosmetic layer can be provided as a thin coat, for example, a coating of about 0.1-0.3 mm. In one implementation, the thin coating can be about 0.15 mm thick and be deposited on the thin film. For example, the thin coating can be sprayed on or printed onto the surface of the thin film.

Next, the outer glass member can be affixed 208 to the thin film. In one implementation, an optically clear adhesive can be used to affix 208 the outer glass member to the thin film. Here, the outer glass member can be transparent (i.e., clear) so that the device housing can allow a display device provided inside the device housing to be viewed by a user of the electronic device. Hence, at least to the extent that the outer glass member is adjacent or over the thin film, the thin film can also be transparent (i.e., clear). As such, the display device is visible through the outer glass member, the optically clear adhesive, and the thin film. After the outer glass member has been affixed 208 to the thin film, an outer molded member can be insert molded 210 against the thin film and the outer glass member. Although insert molding of material, such as polymers, into an outer molded member adjacent the outer glass member suffers from poor adhesion because the molded material poorly adheres to glass. However, the presence of the thin film can be formed from a polymer and can thus strongly adhere to the molded material. The thin film thus serves to secure and retain the outer glass member to the outer molded material. The outer glass member can also include one or more edge features to assist in securing the outer glass member to the outer molded material. However, given that the outer glass member is thin, such as less than 3 mm, the ability to provide significant retention features is limited.

FIGS. 3A-3F are diagrams illustrating assembly of a portion of an electronic device housing according to one embodiment.

Figure 3A:
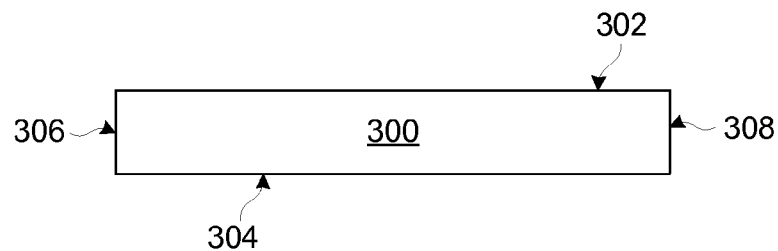
FIGS. 3A-3F are diagrams illustrating assembly of a portion of an electronic device housing according to one embodiment.

FIG. 3A is a diagram of an exemplary outer glass member 300. The outer glass member 300 is a glass piece that is sized to fit as a top outer surface for some portion of an electronic device housing. The thickness of the outer glass member 300 can vary with implementation, but for most embodiments using thin glass pieces, the thickness is about 0.4-3 millimeters (mm). More specifically, for one particular example useful for a handheld electronic device, the thickness of the thin glass is about 0.5-1 mm. The outer glass member 300 includes a top surface 302, a bottom surface 304, a left surface 306 and a right surface 308.

Figure 3B:
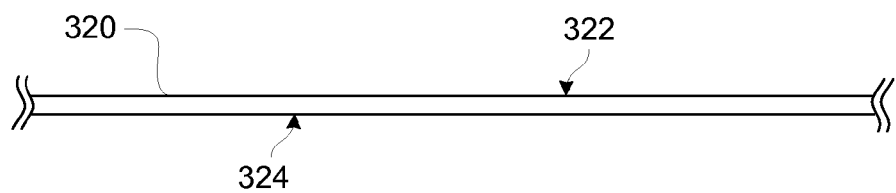

FIG. 3B is a diagram of an exemplary thin film member 320. Once the electronic device housing is assembled, the thin film member 320 serves as a substrate for at least the outer glass member 300. The thin film is thin and transparent. The thickness of the thin film member 320 can vary with implementation, but for most embodiments using thin glass pieces, the thickness is about 0.05-0.5 millimeters (mm). More specifically, for one particular example useful for a handheld electronic device, the thickness of the thin film member 320 is about 0.1-0.2 mm, such as 0.15 mm. The thin film member 320 includes a top surface 322 and a bottom surface 324.

Figure 3C:
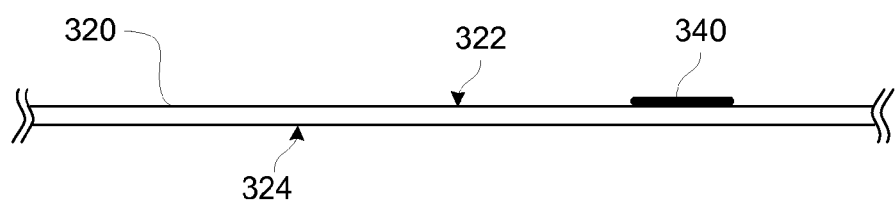

FIG. 3C is a diagram of the exemplary film member 320 illustrated in FIG. 3B after a cosmetic layer 340 is deposited. In this embodiment, the cosmetic layer 340 is deposited on a portion of the top surface 322 of the film member 320. For example, the cosmetic layer 340 can be deposited using a printing technique. The cosmetic layer 340 is thin and transparent. The thickness of the cosmetic layer 340 can vary with implementation but for most embodiments, the thickness is 0.05-1.5 millimeters (mm). More specifically, for one particular example useful for a handheld electronic device, the thickness of the cosmetic layer 340 is about 0.1 mm.

Figure 3D:
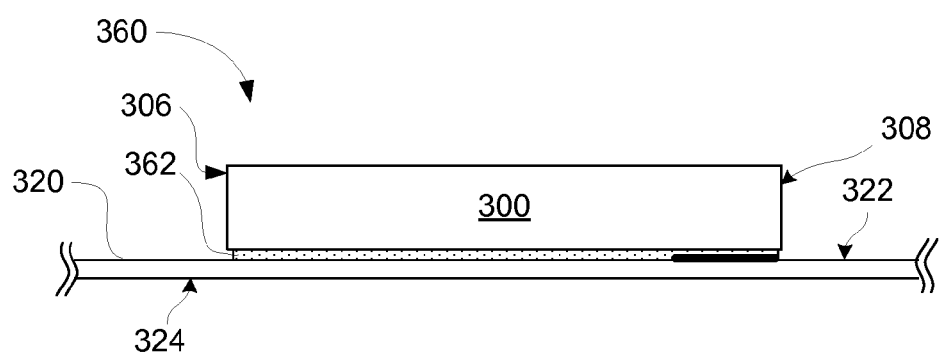

FIG. 3D is a diagram of an exemplary assembly 360 according to one embodiment. The exemplary assembly 360 attached the outer glass member 300 to the thin film 322. In particular, the bottom surface 304 of the outer glass member 300 can be attached to the top surface 322 of the thin film member 320. A layer of adhesive 362 is provided between the outer glass member 300 and the thin film 320 so as to secure the outer glass member 300 to the thin film 320. Once assembled, the cosmetic layer 340 can be provided adjacent the periphery of the outer glass member 300.

Figure 3E:
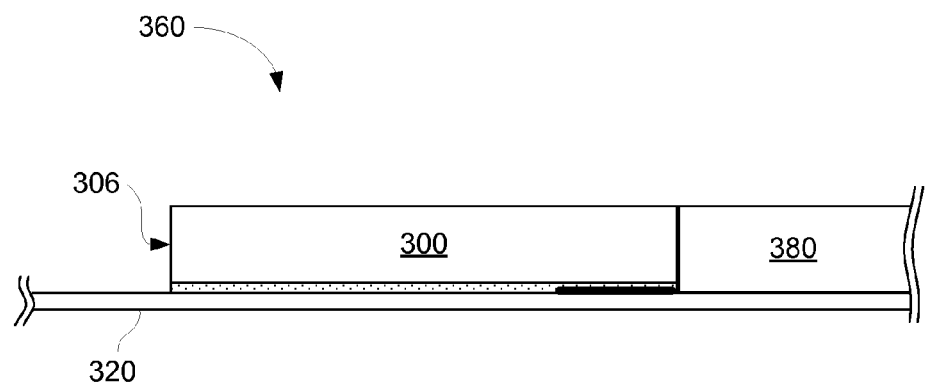

FIG. 3E is a diagram of the exemplary assembly 360 illustrated in FIG. 3D after an outer molded member 380 is formed (i.e., molded) to the assembly 360. The outer molded member 380 can be molded adjacent the top surface 322 of the thin film member 320 and also adjacent to the right surface 308 of the outer glass member 300.

Figure 3F:
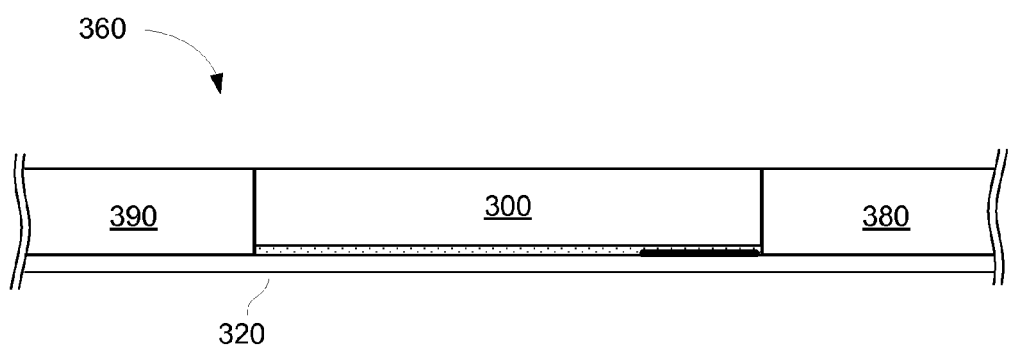

FIG. 3F is a diagram of the exemplary assembly 360 illustrated in FIG. 3E after an outer molded member 390 is formed (i.e., molded) to the assembly 360. The outer molded member 390 can be molded adjacent the top surface 322 of the thin film member 320 and also adjacent to the left surface 306 of the outer glass member 300.

Figure 4A:
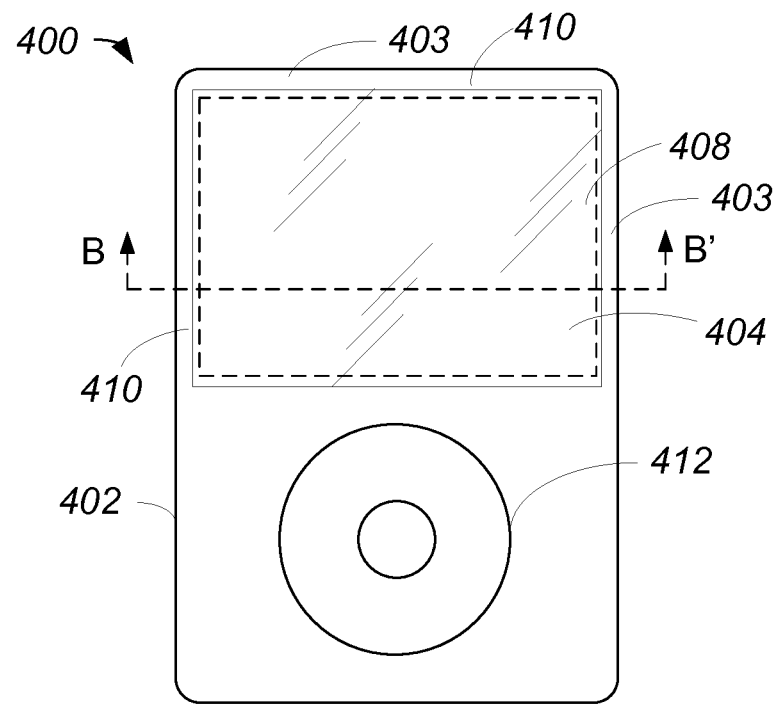
FIGS. 4A-4C are diagrammatic representations of electronic device according to another embodiment of the invention.
Figure 4B:
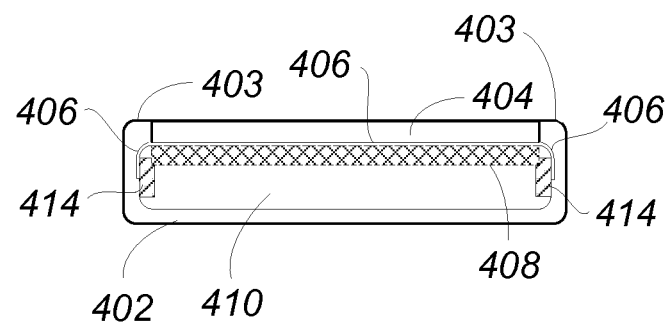
Figure 4C:
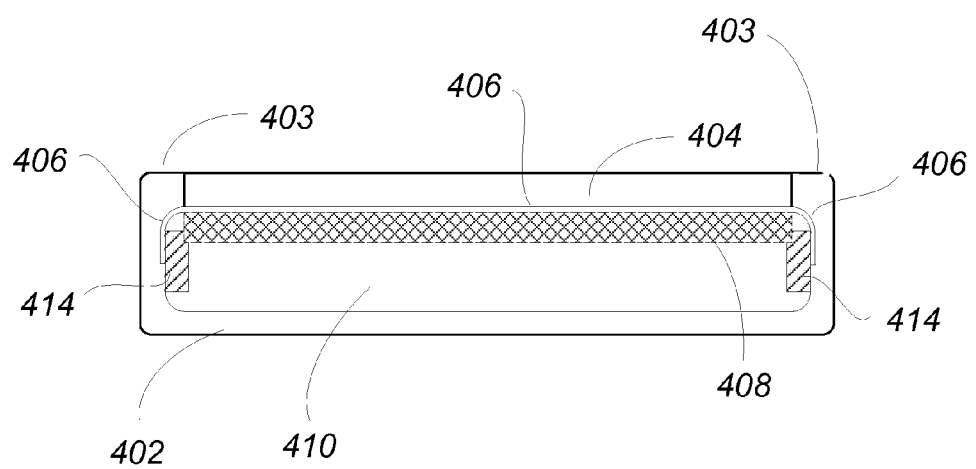

FIGS. 4A-4C are diagrammatic representations of electronic device 400 according to another embodiment of the invention. FIG. 4A illustrates a top view for electronic device 400, and FIG. 4B illustrates a cross-sectional side view for electronic device 400 with respect to reference line B-13'. FIG. 4C illustrates an expanded cross-sectional side view for electronic device 400 with respect to reference line B-13'. Electronic device 400 shown in FIGS. 4B and 4C are the same cross-sectional view for electronic device 400, though the illustration in FIG. 4C is expanded to facilitate ease of understanding.

Electronic device 400 can include housing 402 that has glass cover window 404 (glass cover) as a top surface. In this embodiment, cover window 404 can be protected by side surfaces 403 of housing 402. Side surfaces 403 can be adjacent to the outer surface of cover window 404. Side surfaces 403 can be integral with housing 402, or side surface 403 could be separate from housing 402 and, for example, operate as a bezel for cover window 404. Side surfaces 403 can be molded adjacent to thin film 706 that is provided below cover window 404. Cover window 404 is at least primarily transparent so that display assembly 408 is visible through cover window 404. Display assembly 408 can, for example, be positioned adjacent cover window 404. Housing 402 can also contain internal electrical components besides display assembly 408, such as a controller (processor), memory, communications circuitry, etc. Display assembly 408 can, for example, include a LCD module. By way of example, display assembly 408 may include a Liquid Crystal Display (LCD) that includes a Liquid Crystal Module (LCM). In one embodiment, cover window 404 is integrally formed with the LCM. Housing 402 can also include an opening 410 for containing the internal electrical components to provide electronic device 400 with electronic capabilities. Within opening 410 are one or more internal structures 414 that can support or secure display assembly 408 or that can provide attachment features for supporting or securing other components internal to opening 410.

The front surface of electronic device 400 can also include user interface control 412 (e.g., click wheel control). In this embodiment, cover window 404 does not cover the entire front surface of electronic device 400. Electronic device 400 essentially includes a partial display area that covers a portion of the front surface.

Cover window 404 may generally be arranged or embodied in a variety of ways. By way of example, cover window 404 may be configured as a protective glass piece that is positioned over an underlying display (e.g., display assembly 408) such as a flat panel display (e.g., LCD) or touch screen display (e.g., LCD and a touch layer). Alternatively, cover window 404 may effectively be integrated with a display, i.e., glass window may be formed as at least a portion of a display. Additionally, cover window 404 may be substantially integrated with a touch sensing device such as a touch layer associated with a touch screen. In some cases, cover window 404 can serve as the outer most layer of the display.

As noted above, the electronic device can be a handheld electronic device or a portable electronic device. Embodiments of the invention can serve to enable a glass cover to be not only thin but also supported in a space efficient manner. As such, the invention is well suited for implementation of glass surfaces for handheld electronic device or a portable electronic device that are designed to be thin.

The glass cover (or cover window) is particularly useful for thin glass applications. For example, the thickness of a glass cover can be between about 0.5-2.5 mm. More specifically, the glass cover can have a thickness is less than about 2 mm, or even thinner than about 1 mm, or still even thinner than about 0.8 mm.

In one embodiment, the size of the glass cover depends on the size of the associated electronic device. For example, with handheld electronic devices, the size of the glass cover is often not more than five (5) inches (about 12.7 cm) diagonal. As another example, for portable electronic devices, such as smaller portable computers or tablet computers, the size of the glass cover is often between four (4) (about 10.2 cm) to twelve (12) inches (about 30.5 cm) diagonal. As still another example, for portable electronic devices, such as full size portable computers, displays or monitors, the size of the glass cover is often between ten (10) (about 25.4 cm) to twenty (20) inches (about 50.8 cm) diagonal or even larger.

However, it should be appreciated that with larger the screen sizes, the thickness of the glass layers may need to be greater. The thickness of the glass layers may need to be increased to maintain planarity of the larger glass layers. While the displays can still remain relatively thin, the minimum thickness may increase with increasing screen size. For example, the minimum thickness of the glass cover can correspond to about 0.4 mm for small handheld electronic devices, about 0.6 mm for smaller portable computers or tablet computers, about 1.0 mm or more for full size portable computers, displays or monitors, again depending on the size of the screen. The thickness of the glass cover can depend on the application and/or the size of electronic device.

Figure 5A:
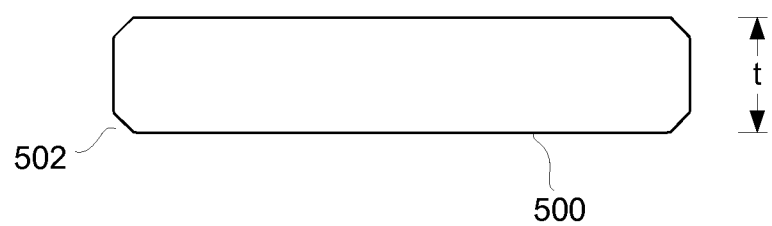
FIG. 5A is a cross-sectional diagram of a glass cover for an electronic device housings according to an embodiment that pertains to a chamfered edge geometry.

FIG. 5A is a cross-sectional diagram of a glass cover 500 for an electronic device housings according to an embodiment that pertains to a chamfered edge geometry. More particularly, FIG. 5A illustrates a cross-sectional diagram of glass cover 500 having edge geometry 502. The thickness (t) for the glass cover is about 1.0 millimeter. Edge geometry 502 has flattened edges. Edge geometry 502 is effectively a chamfered edge. A chamfer is a beveled edge that substantially connects two sides or surfaces. In one embodiment, a chamfered edge may have a depth of between approximately 0.15 millimeters and approximately 0.25 millimeters. By way of example, edge geometry 502 may include an approximately 0.15 millimeter chamfer or an approximately 0.25 millimeter chamfer.

Using chamfered edges on an outer housing member, such as a glass cover, can serve to assist with retention of the outer housing member. In particular, the chamfers act as retention features on the sides of the outer housing member once molded outer members are formed (e.g., through injection molding) adjacent to such sides.

Figure 5B:
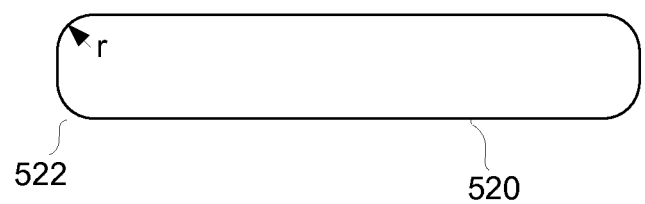
FIG. 5B illustrates a cross-sectional diagram of a glass cover having an edge geometry.

FIG. 5B illustrates a cross-sectional diagram of a glass cover 520 having an edge geometry 522, such as a rounded edge geometry. In one embodiment, the thickness (t) for the glass cover is about 1.0 millimeter, although it should be appreciated that thickness (t) may vary. In one embodiment, edge geometry 522 can have an edge radius (r) of, for example, about 0.3 millimeters, although it should be appreciated that edge radius (r) may vary. More generally, the edges of the edge geometry 522 can be rounded to an edge radius of 10-50% of the thickness of the cover glass.

FIGS. 6A and 6B are cross sectional diagrams of glass cover 500 being assembled in a portion of an electronics device, similar to described above with reference to FIGS. 3A-3D. Glass cover 500, which can be referred to as a housing member, has top surface 602 and bottom surface 604, and first side wall 606 and second side wall 608. As described above, glass cover 500 can have beveled or chamfered edge geometries (502). In FIGS. 6A and 6B, these edge geometries are referred to as first top engagement surfaces 610, first bottom engagement surface 612, second top engagement surface 616 and second bottom engagement surface 618. In particular, top surface 602 and first side wall 606 are separated by first top engaging surface 610; and bottom surface 604 and the first side wall 606 is separated by first bottom engaging surface 612.

Film 624 can be coupled to glass cover 500 via adhesive layer 622. In some embodiments, a mask or cosmetic layer (e.g., cosmetic layer 340 described above) can be positioned between portions of adhesive layer 622 and film 624. In some cases, adhesive layer 622 is adhered to substantially the entire bottom surface 604 of glass cover 500 and has an area corresponding to bottom surface 604 of the housing member glass cover 500. In some cases film 624 has an area that is larger than the area of adhesive layer 622 leaving some remainder portion 626 of film 624 unadhered to the adhesive layer 622, as shown in FIGS. 6A and 6B. First molded member 614 can be molded onto and engaged with first top engaging surface 610 and bottom engaging surface 612 of glass cover 500 and with at least part of remainder portion 626 of film 624. In this way, engagement surfaces 610 and 612 can serve to assist with retention of glass cover 500, i.e., lock glass cover 500 in place. FIG. 6B illustrates second molded member 620 molded onto and engaged with second top engaging surface 616 and second bottom engaging surface 618 of glass cover 500 and with another part of remainder portion 626 of film 624.

It should be noted that glass cover 520 illustrated in FIG. 5B can be assembled in a portion of an electronic device; similar to described above with reference to FIGS. 3A-3D and FIGS. 6A-6B.

In general, the steps associated with the methods of the present invention may vary widely. Steps may be added, removed, altered, combined, and reordered without departing from the spirit or the scope of the present invention.

Although the above discussion with respect to FIGS. 1-5B is primarily concerned with embodiments of a display housing employing a thin film substrate. In other embodiments, a thin metal substrate can instead be used. The thin metal substrate can, for example, be formed of steel (e.g., stainless steel) or aluminum. The thin metal substrate is thin as is the thin film substrate and can be attached and used in the same manner. However, since metal is opaque, an opening is provided in the thin metal substrate so that an outer housing member (e.g., cover window) that is transparent can be used to view a display assembly provided within the device housing. The thin metal film can provide a viewable display area border that is opaque but includes an opening for viewing the display assembly.

The various aspects, features, embodiments or implementations of the invention described above may be used alone or in various combinations.

While this specification contains many specifics, these should not be construed as limitations on the scope of the disclosure or of what may be claimed, but rather as descriptions of features specific to particular embodiment of the disclosure. Certain features that are described in the context of separate embodiments may also be implemented in combination. Conversely, various features that are described in the context of a single embodiment may also be implemented in multiple embodiments separately or in any suitable subcombination. Moreover, although features may be described above as acting in certain combinations, one or more features from a claimed combination can in some cases be excised from the combination, and the claimed combination may be directed to a subcombination or variation of a subcombination.

While embodiments and applications have been shown and described, it would be apparent to those skilled in the art having the benefit of this disclosure that many more modifications than mentioned above are possible without departing from the inventive concepts herein.

What is claimed:

1. An electronic device, comprising:
   a housing member having a bottom surface, a top surface and a side wall, wherein the top surface and the side wall are separated by a top engaging surface, wherein the bottom surface and the side wall are separated by a bottom engaging surface, wherein at least a portion of the top surface is exposed;
   an adhesive layer adhered to substantially the entire bottom surface of the housing member, the adhesive layer having an area corresponding to the bottom surface of the housing member;
   a film adhered to the adhesive layer; wherein the film has an area that is larger than the area of the adhesive layer, thereby leaving a remainder portion of the film unadhered to the adhesive layer;
   a molded member engaged with the top engaging surface and the bottom engaging surface of the housing member and with at least part of the remainder portion of the film.

2. The electronic device as recited in claim 1, wherein the housing member is a window of the electronic device.

3. The electronic device as recited in claim 2, wherein the window has a thickness ranging from about 0.4 mm to about 2.5 mm.

4. The electronic device as recited in claim 3, wherein the window has a thickness of about 1 mm or less.

5. The electronic device as recited in claim 2, further comprising:
   a mask positioned between the film and the adhesive layer, the mask hiding internal portions of the electronic device from being viewable through the window.

6. The electronic device as recited in claim 1, wherein the film has a thickness ranging from about 0.1 mm to about 0.5 mm.

7. The electronic device as recited in claim 1, wherein the film is comprised of a substantially transparent polymer.

8. The electronic device as recited in claim 1, wherein the adhesive layer is substantially transparent.

9. The electronic device as recited in claim 1, wherein the remainder portion of the film has a bent shape corresponding to a bent portion of the molded member.

10. An electronic device, comprising:
    a display assembly comprising:
    a window having a bottom surface, a top surface and a side wall, wherein the top surface and the side wall are separated by a top engaging surface, wherein the bottom surface and the side wall are separated by a bottom engaging surface,
    an adhesive layer adhered to substantially the entire bottom surface of the window, the adhesive layer having an area corresponding to the bottom surface of the window, and
    a film adhered to the adhesive layer, wherein the film has an area that is larger than the area of the adhesive layer, thereby leaving a remainder portion of the film unadhered to the adhesive layer; and
    a molded member engaged with the top engaging surface and bottom engaging surface of the window and engaged with at least part of the remainder portion of the film.

11. The electronic device as recited in claim 10, wherein the top surface of the window corresponds to an outer portion of the electronic device.

12. The electronic device as recited in claim 10, wherein the film is optically clear.

13. The electronic device as recited in claim 10, wherein the adhesive layer is optically clear.

14. The electronic device as recited in claim 10, wherein the molded member is part of a molded housing for the electronic device.

15. The electronic device as recited in claim 14, further comprising at least one internal support structure configured to support the display assembly within the molded housing.

16. The electronic device as recited in claim 15, wherein the at least one internal support structure is secured to an inner surface of the molded housing.

17. The electronic device as recited in claim 10, wherein the window is comprised of glass.

18. The electronic device as recited in claim 10, wherein the top engaging surface prevents disengagement of the molded member from the window in a first direction and the bottom engaging surface prevents disengagement of the molded member form the window in a second direction opposite the first direction.

19. The electronic device as recited in claim 10, wherein the film is an opaque film, the opaque film having a central opening aligned with a central portion of the window.

20. The electronic device as recited in claim 19, wherein the opaque film is a metal substrate.

* * * * *